(12) United States Patent
Cirillo

(10) Patent No.: US 10,585,120 B2
(45) Date of Patent: Mar. 10, 2020

(54) SIGNAL ANALYSIS IN TIME AND FREQUENCY

(71) Applicant: Rohde & Schwarz GmbH & Co. KG, Munich (DE)

(72) Inventor: Luke Cirillo, Poing (DE)

(73) Assignee: ROHDE & SCHWARZ GMBH & CO. KG, Munich (DE)

( * ) Notice: Subject to any disclaimer, the term of this patent is extended or adjusted under 35 U.S.C. 154(b) by 249 days.

(21) Appl. No.: 15/804,544

(22) Filed: Nov. 6, 2017

(65) Prior Publication Data

US 2018/0059142 A1 Mar. 1, 2018

Related U.S. Application Data

(63) Continuation of application No. 14/003,259, filed as application No. PCT/EP2012/058516 on May 9, 2012, now Pat. No. 9,810,716.

(30) Foreign Application Priority Data

May 11, 2011 (DE) .......................... 10 2011 075 669

(51) Int. Cl.
    *G06F 11/30* (2006.01)
    *G01R 13/02* (2006.01)
    *G01R 23/18* (2006.01)
(52) U.S. Cl.
    CPC ....... *G01R 13/029* (2013.01); *G01R 13/0236* (2013.01); *G01R 23/18* (2013.01)
(58) Field of Classification Search
    CPC .................................................. G01R 13/029
    See application file for complete search history.

(56) References Cited

U.S. PATENT DOCUMENTS 9,810,716 B2 * 11/2017 Cirillo ................ G01R 13/0236
2005/0261847 A1 11/2005 Nara
(Continued)

FOREIGN PATENT DOCUMENTS

EP    1 699 142 A1    9/2006
EP    2 096 451 A1    9/2009
(Continued)

OTHER PUBLICATIONS

International Search Report issued in corresponding application No. PCT/EP2012/058516 dated Sep. 11, 2012. Found in Parent U.S. Appl. No. 14/003,259.

(Continued)

*Primary Examiner* — Phuong Huynh
(74) *Attorney, Agent, or Firm* — Carter, DeLuca & Farrell LLP

(57) ABSTRACT

An arrangement for signal analysis provides at least one central data-processing unit and a screen unit connected to the at least one central data-processing unit, wherein the central data-processing unit calculates a spectrum and a spectrogram from a digitised signal. The at least one central data-processing unit is embodied in such a manner that it controls the screen unit in such a manner that the spectrogram of the digitised signal, the characteristic of the spectrum of the digitised signal and the characteristic of the digitised signal present in the time domain can be displayed together on the screen unit.

25 Claims, 7 Drawing Sheets

(56) References Cited

U.S. PATENT DOCUMENTS

Figure 1:
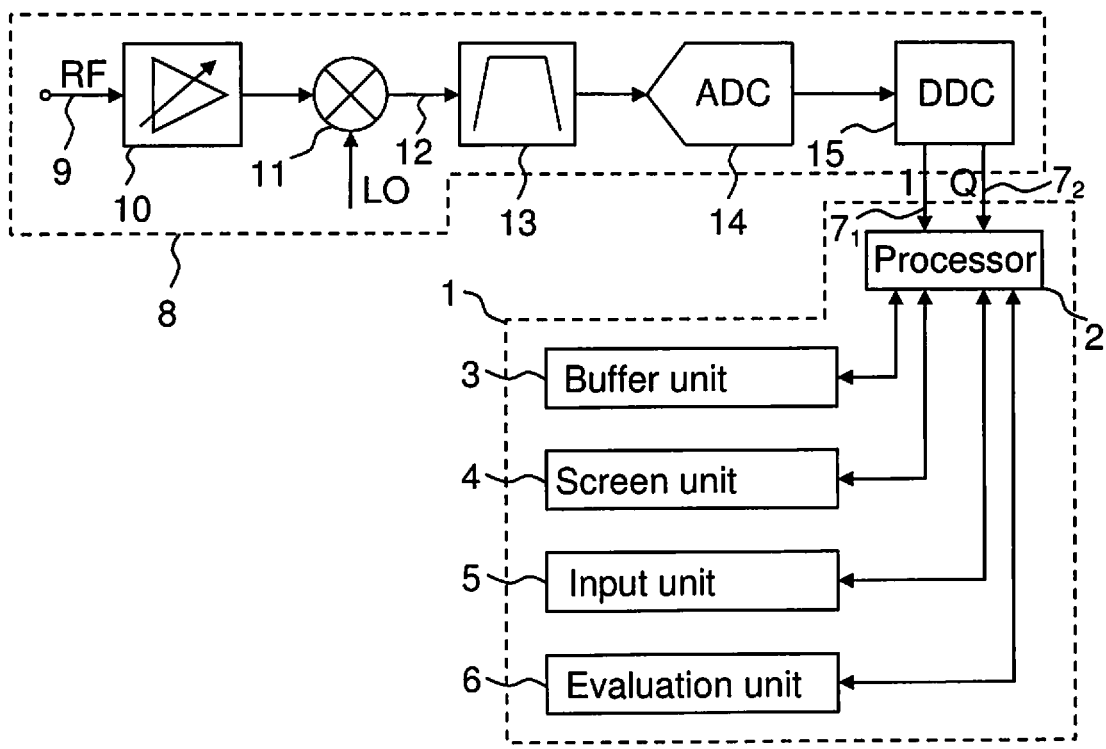

2008/0259082 A1  10/2008  Engholm et al.
2010/0153044 A1   6/2010  Nara

FOREIGN PATENT DOCUMENTS

| EP | 2 113 777 A1 | 11/2009 |
| EP | 2 418 497 A2 | 2/2012 |
| WO | 2007/076174 A2 | 7/2007 |
| WO | WO 2007076174 A2 * | 7/2007 |

OTHER PUBLICATIONS

Written Opinion issued in corresponding application No. PCT/EP2012/058516 dated Nov. 21, 2013. Found in Parent U.S. Appl. No. 14/003,259.

* cited by examiner

SIGNAL ANALYSIS IN TIME AND FREQUENCY

The invention relates to a device and a method for the analysis of various signals in the time domain and also in the frequency domain.

In the development of communications systems, for example, wireless communications systems, it is important that these operate in accordance with specified standards. It is also desirable to be able to analyse the high-frequency communications signal generated by the mobile communications system in order to determine errors in the development process as quickly as possible. Any deviations in the high-frequency communications signal from the underlying standard can be determined in this manner. To analyse such a high-frequency communications signal, the signal must first be recorded digitally by means of a signal analyser, for example, an oscilloscope.

A signal analyser and a method for the latter for the analysis of a recorded high-frequency communications signal are known from EP 2 113 777 A1. The high-frequency communications signal is transformed into the frequency domain in order to display its spectrum and its spectrogram in a diagram. The disadvantage with EP 2 113 777 A1 is that not all errors are identifiable in the spectrogram and the characteristic of the spectrum.

Accordingly, the object of the arrangement according to the invention for signal analysis and the method according to the invention for operating the arrangement for signal analysis is to provide a solution in order to condition a recorded high-frequency communications signal in such a manner that any errors in the high-frequency communications signal which suggest an incorrect implementation of the underlying standard or defective hardware, are recognised with as high a probability as possible.

The object is achieved with regard to the arrangement for signal analysis by the features of claim 1 and with regard to the method for operating the arrangement for signal analysis by the features of claim 10. Claim 18 specifies a computer program with program-code means in order to implement all of the method steps when the program is executed on a computer or a digital-signal processor. Claim 19 specifies a computer-software product especially with program code means stored on a machine-readable carrier in order to implement all of the method steps when the program is executed on a computer or a digital-signal processor. Advantageous further developments of the arrangement according to the invention for signal analysis and the method according to the invention for operating the arrangement for signal analysis are specified in the respective dependent claims.

The arrangement according to the invention for signal analysis provides at least one central data-processing unit and a screen unit connected to the at least one central data-processing unit. The central data-processing unit calculates a spectrum and a spectrogram from a digitised signal. In this context, the at least one central data-processing unit is embodied in such a manner that it controls the screen unit in such a manner that the spectrogram of the digitised signal, the characteristic of the spectrum of the digitised signal and the characteristic of the digitised signal present in the time domain can be displayed together on the screen unit. It is particularly advantageous that the information contained in the digitised signal can be displayed in different ways, as completely as possible and together. As a result of the fact that the digitised signal can be displayed in three different ways, interference can be determined particularly well.

The method according to the invention for operating the arrangement for signal analysis, which provides a central data-processing unit and a screen unit connected to the at least one central data-processing unit, comprises several method steps. In a first method step, the spectrum and the spectrogram are calculated from the digitised signal by the central data-processing unit. In a further method step, the spectrogram of the digitised signal, the characteristic of the spectrum of the digitised signal and the characteristic of the digitised signal present in the time domain are displayed together on the screen unit by the at least one central data-processing unit. It is particularly advantageous that both the spectrogram and also the characteristics of the digitised signal in the time domain and in the frequency domain are displayed together on the screen unit, which considerably facilitates the analysis of the digitised signal.

A further advantage of the arrangement according to the invention for signal analysis is achieved if the digitised signal can be buffered by the at least one central data-processing unit in a buffer unit and if the digitised signal is transformed by the at least one central data-processing unit into the frequency domain and can be buffered in the buffer unit. This ensures, for example, that calculation-intensive steps, such as the transformation of the digitised signal into the frequency domain, only need to be implemented once.

A further advantage is achieved with the arrangement according to the invention for signal analysis if a frequency range and time range within the spectrogram can be freely selected and if the characteristic of the spectrum and the time characteristic of the digitised signal can be updated and displayed on the screen unit by the at least one central data-processing unit for the selected frequency range and time range, and/or if the frequency range selected in the spectrogram can be plotted by the at least one central data-processing unit in the second diagram, and/or if the time range selected in the spectrogram can be plotted by the at least one central data-processing unit in the third diagram. It is possible to analyse the digitised signal in greater detail in a particularly advantageous manner as a result of the possibility that a given frequency range and time range can be selected within the spectrogram, whereas the characteristic of the spectrum and the time characteristic of the digitised signal can be updated dependent upon the selected frequency range and time range. It is also particularly advantageous that the selected frequency range can be plotted in the characteristic of the spectrum and the selected time range can be plotted in the time characteristic of the digitised signal. This facilitates the allocation of the individual signal components of the digitised signal in the spectrogram to the characteristics in the frequency and time domain.

Moreover, an advantage is achieved with the arrangement according to the invention for signal analysis if the digitised signal present in the time domain can be filtered through a bandpass filter, whereas the pass range of the bandpass filter corresponds to the selected frequency range of the first diagram for the spectrogram or to the selected frequency range of the second diagram for the characteristic of the spectrum. Accordingly, it can be ensured that only those signal components in the characteristic of the time range of the present digitised signal which are disposed within the desired frequency range appear in the third diagram.

Finally, an advantage is achieved with the arrangement according to the invention for signal analysis if the part of the digitised signal which is disposed in the selected time range and/or frequency range can be transferred by the at least one central data-processing unit to a selection unit.

Such a selection unit can evaluate, for example, the part of the digitised signal which contains the payload data to be transmitted with regard to whether this part corresponds to the structure of the underlying standard. The evaluation unit can also contain a modulation analysis.

A further advantage of the method according to the invention for operating an arrangement for signal analysis is achieved if an arbitrary frequency range within the second diagram for the characteristic of the spectrum can be selected, and if the time characteristic of the digitised signal can be updated by the at least one central data-processing unit dependent upon the selected frequency range, and/or if the selected frequency range is plotted by the at least one central data-processing unit into the first diagram for the spectrogram. This means that the interesting ranges within the characteristic of the spectrum can also be highlighted in the spectrogram and in the time characteristic for the digitised signal.

Furthermore, an advantage is achieved with the method according to the invention for operating the arrangement for signal analysis if a time range within the third diagram is freely selected for the time characteristic of the digitised signal, and if the characteristic of the spectrum is updated dependent upon the selected time range, and/or if the selected time range is plotted in the diagram for the spectrogram by the at least one central data-processing unit. This means that the interesting parts of the digitised signal which are selected in the time characteristic of the digitised signal can also be displayed more clearly in the other two diagrams.

Finally, an advantage is achieved with the method according to the invention for operating the arrangement for signal analysis if the filtered, digitised signal is decimated in its resolution by the first detector unit, so that the decimated, digitised signal corresponds to a resolution of the screen unit, whereas either the mean value or mean squared value or the maximum value or the minimum value or the auto-peak value (German: automatischer Spitzenwert) of at least two values of the digitised signal is calculated by the first detector unit, and/or if the digitised signal transformed into the frequency range is decimated by the second detector unit in its resolution, so that the decimated, digitised signal corresponds to a resolution of the screen unit, whereas either the mean value for the mean squared value or the maximum value or the minimum value or the auto-peak value of at least two values of the digitised signal is calculated by the second detector unit. The various possibilities, with which the first and the second detector unit can be operated, mean that even interference spurs of very short duration can be displayed on the screen unit.

Figure 2:
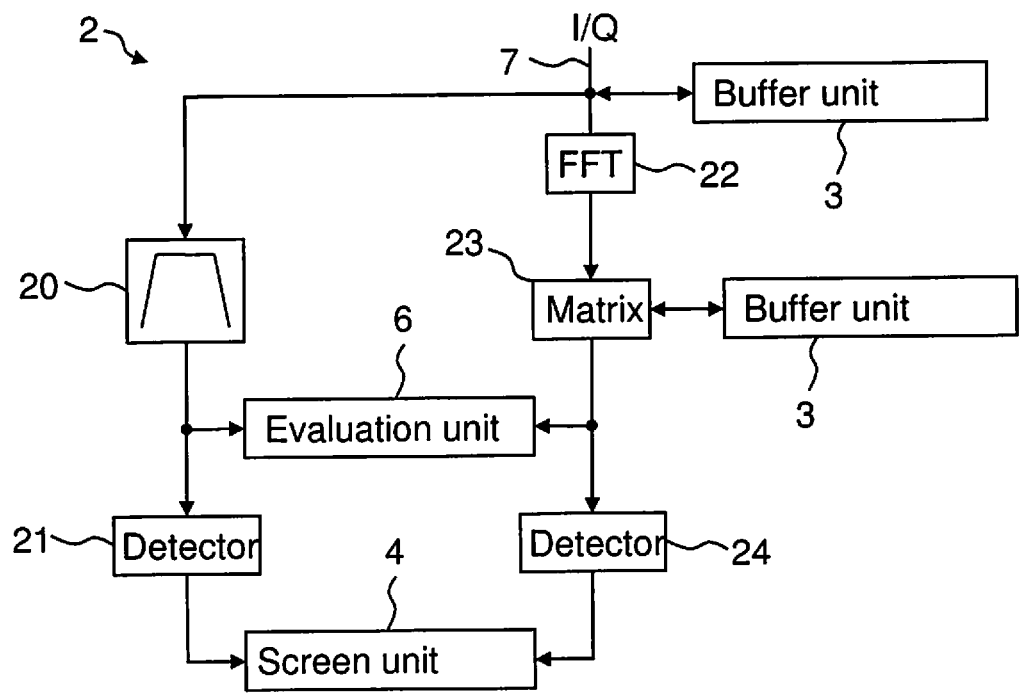
Figure 3:
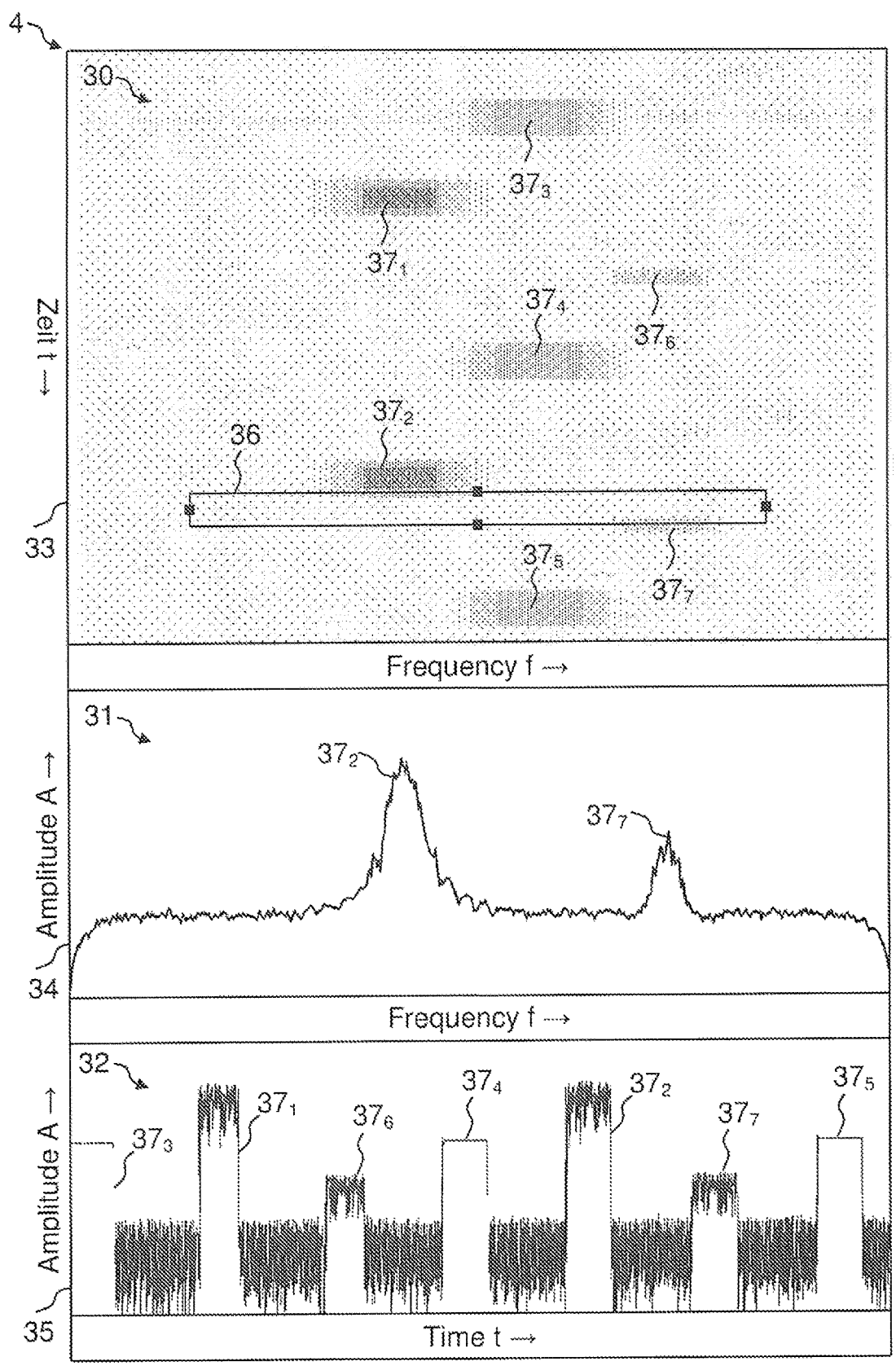
Figure 4:
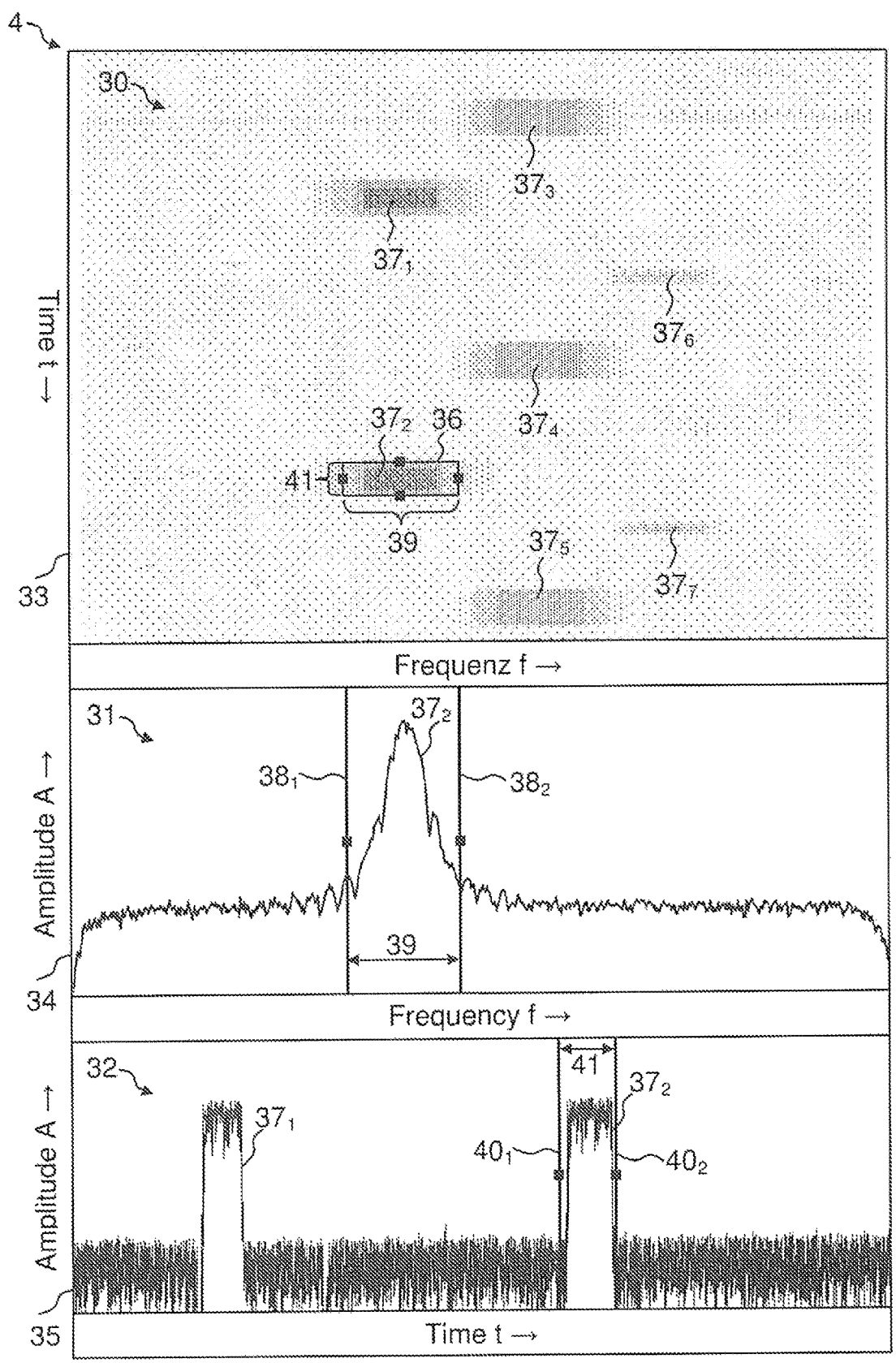
Figure 5A:
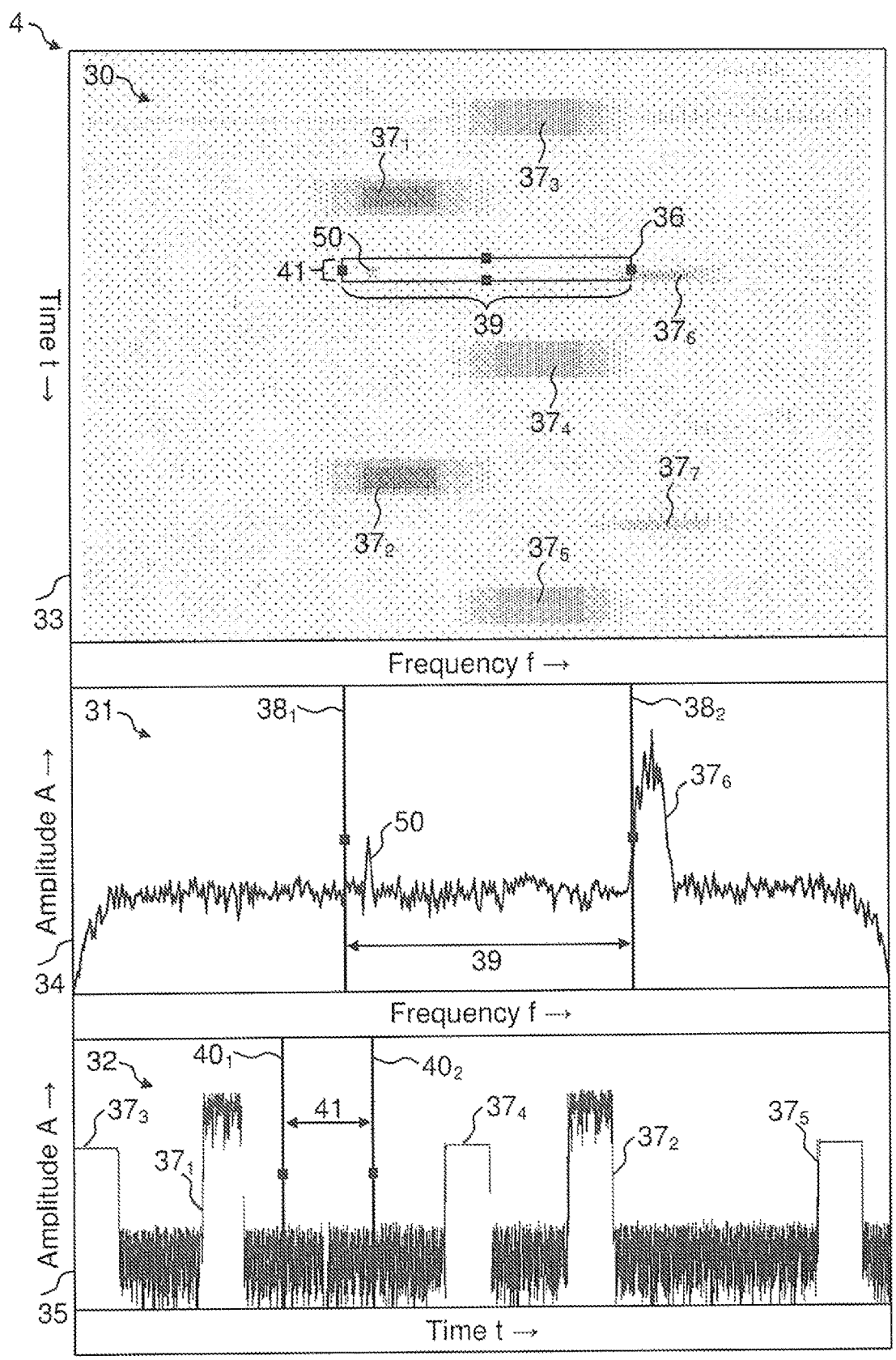
Figure 5B:
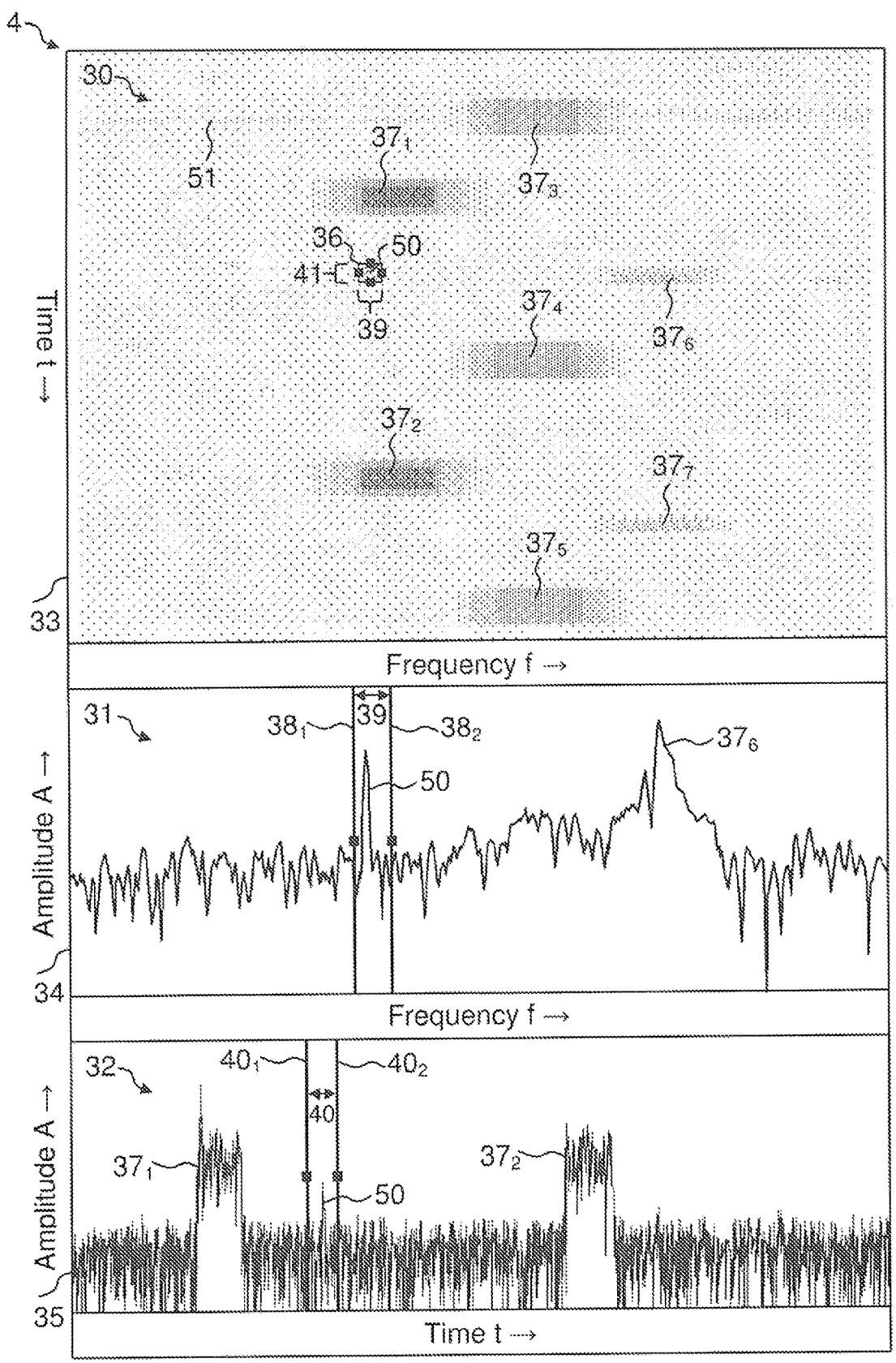
Figure 6:
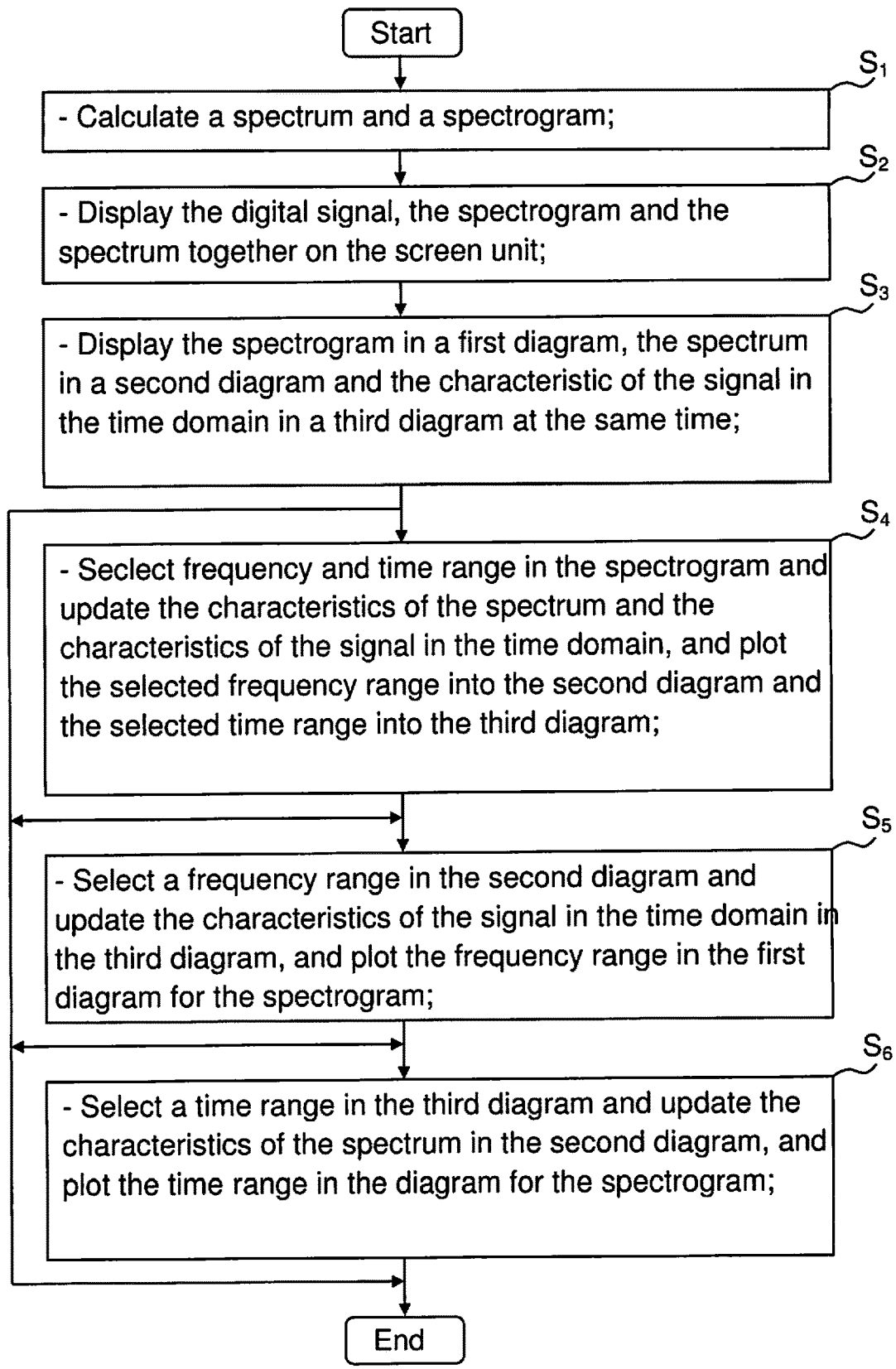
Figure 7:
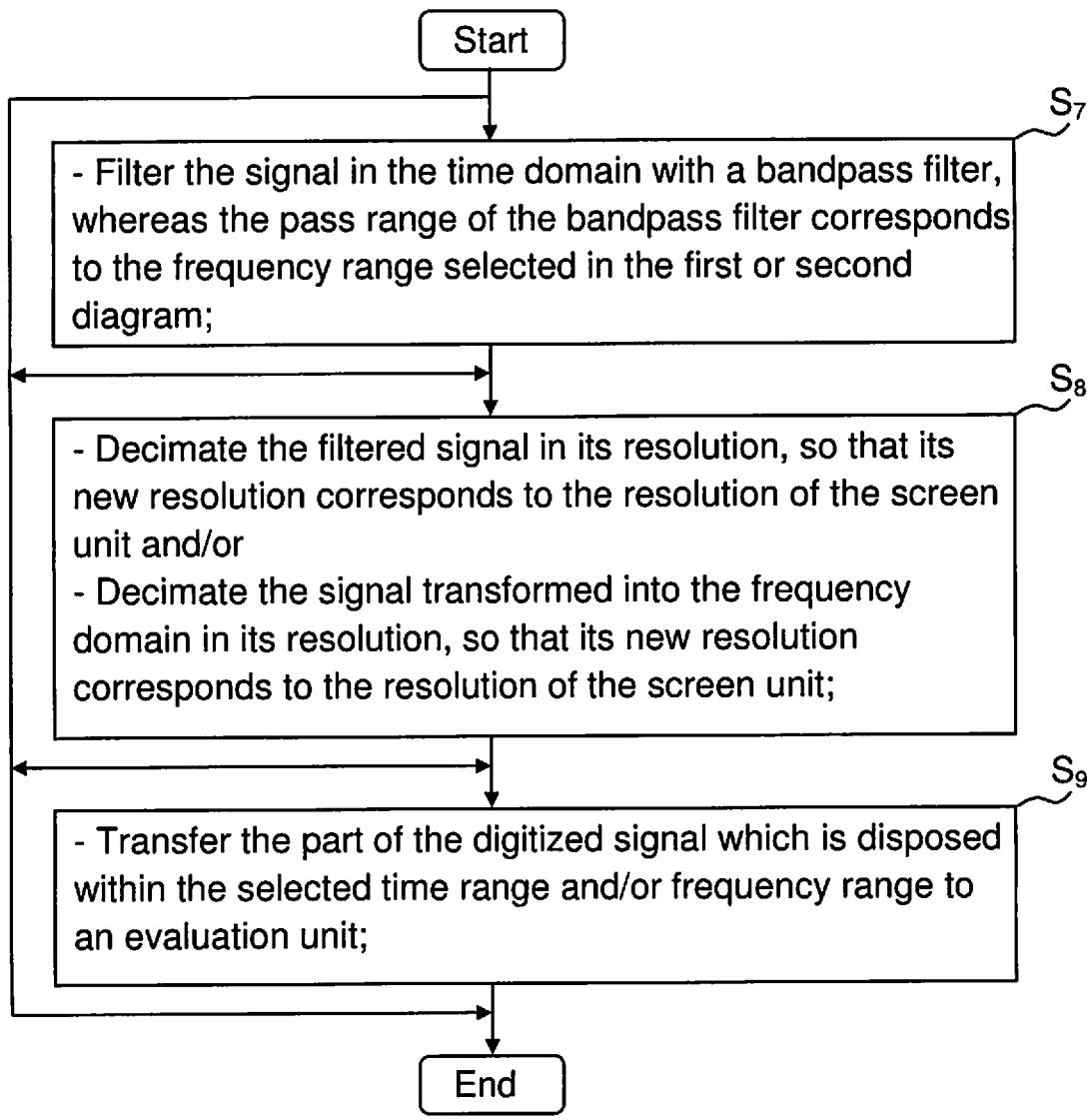

Various exemplary embodiments of the invention are described by way of example below with reference to the drawings. Identical subject matters provide the same reference numbers. In detail, the corresponding figures of the drawings are as follows:

FIG. 1 an exemplary embodiment of a block-circuit diagram, which shows the structure of the arrangement according to the invention for signal analysis;

FIG. 2 a further exemplary embodiment of a block-circuit diagram of the invention, which describes in greater detail the method of functioning of the central data-processing unit within the arrangement for signal analysis;

FIG. 3 an exemplary embodiment, which describes in greater detail the method of functioning of the arrangement according to the invention for signal analysis after the loading of a signal to be analysed;

FIG. 4 a further exemplary embodiment, which describes in greater detail the method of functioning of the arrangement according to the invention for signal analysis after the loading of a signal to be analysed;

FIG. 5A an exemplary embodiment, which describes in greater detail the method of functioning of the arrangement according to the invention for signal analysis for analysing interference within a loaded signal;

FIG. 5B a further exemplary embodiment, which describes in greater detail the method of functioning of the arrangement according to the invention for signal analysis for analysing interference within a loaded signal;

FIG. 6 an exemplary embodiment of a flow chart, which describes in greater detail the method of functioning of the arrangement according to the invention for signal analysis; and FIG. 7 a further exemplary embodiment of a flow chart, which describes in greater detail the method of functioning of the arrangement according to the invention for signal analysis.

FIG. 1 shows an exemplary embodiment of a block-circuit diagram which illustrates the structure of the arrangement 1 according to the invention for signal analysis. In this context, the arrangement 1 for signal analysis comprises at least one central data-processing unit 2. The at least one central data-processing unit 2 can comprise one or more processors and/or FGPAs (English: field programmable gate array; German: im (Anwendungs-)Feld-programmierbare (Logik-) Gatter-Anordnung) and/or DPSs (English: digital signal processor; German: digitaler Signalprozessor). At least one buffer unit 3, a screen unit 4, an input unit 5 and an evaluation unit 6 are connected to the at least one central data-processing unit 2.

The at least one buffer unit 3 can be, for example, a random access memory and/or a hard-disk memory, which is embodied within the arrangement 1 for signal analysis and/or connected to the arrangement 1 for signal analysis, for example, via a network port.

The screen unit 4 is preferably a screen unit 4 with a touch-sensitive screen. In this context, touch-sensitive screens which provide a resistive or capacitive or inductive touchscreen are used by preference.

The input unit 5 comprises all of the buttons and/or keys and other input elements, such as a keyboard or mouse connected to the arrangement 1 for signal analysis. All of the inputs registered by the input unit 5 are routed to the at least one central data-processing unit 2.

As will be explained in greater detail later, the evaluation unit 6 connected to the at least one central data-processing unit 2 receives selected components of the digitised signal $7_1$, $7_2$ for further processing. The evaluation unit 6 can be, for example, GSM measurement units (English: global system for mobile communication; German: weltweites System zur mobilen Kommunikation) or UMTS measurement units (English: universal mobile telecommunications system; German: universelles mobile telekommunikationssystem). Such an evaluation unit 6 can also comprise a modulation analysis.

A measured digitised signal $7_1$, $7_2$ is transferred to the arrangement 1 for signal analysis. Such a digitised signal $7_1$, $7_2$ can be recorded, for example, with a signal analyser 8 or an oscilloscope. FIG. 1 illustrates a simplified block-circuit diagram of a signal analyser 8 for this purpose. A high-frequency communications signal 9 to be analysed is amplified in its amplitude by an amplifier 10. Following this, the amplified high-frequency communications signal 9 is mixed down to an intermediate frequency 12 via a mixer 11 by means of the local oscillator signal. The high-frequency communications signal 9 mixed down to an intermediate frequency 12 is then filtered through a bandpass filter 13, before being digitised by an analog/digital converter 14. Via a digital down converter 15 (English: digital down converter), the digitised high-frequency signal is mixed down into the baseband, whereas, in the illustrated exemplary embodiment, the digital down converter 15 outputs an in-phase (German: gleichphasig) component $7_1$ and a quadrature component $7_2$ of the digitised signal 7. The in-phase component $7_1$ and the quadrature component $7_2$ of the digitised signal 7 of the signal analyser 8 is transferred to the at least one central data-processing unit 2 of the arrangement 1 for signal analysis.

FIG. 1 does not show a trigger signal (German: Auslösesignal), which is supplied to the analog/digital converter 14, so that only those parts of the high-frequency communications signal 9 in which the trigger condition is fulfilled are digitised.

FIG. 2 shows a further exemplary embodiment of a block-circuit diagram of the invention, which describes in greater detail the method of functioning of the central data-processing unit 2 within the arrangement 1 for signal analysis. At the start, the digitised signal 7 is transferred to the at least one central data-processing unit 2 within the arrangement 1 for signal analysis. The digitised signal 7 is buffered by the at least one central data-processing unit 2 in a buffer unit 3.

The digitised signal 7 is then filtered through a bandpass filter 20. The pass range of the bandpass filter 20 in this context is adjustable, as will be explained in greater detail below. The filtered, digitised signal 7 can then be transferred by the at least one central data-processing unit 2 to an evaluation unit 6.

The filtered, digitised signal 7 is also further transferred to a first detector unit 21. In the first detector unit 21, the filtered, digitised signal 7 is decimated in its resolution, so that the decimated, filtered, digitised signal 7 corresponds to a resolution of the screen unit 4. The first detector unit 21 calculates from at least two values of the filtered, digitised signal 7 either the mean value or the mean squared value or the maximum value or the auto-peak value. If the screen unit 4 provides, for example, a horizontal resolution of 1000 points, and if the filtered, digitised signal 7 contains, for example, 10,000 measured points, the first detector unit 21 calculates from ten successive measured values of the filtered, digitised signal 7 the mean value or the mean squared value or the maximum value or the minimum value or the auto-peak value.

The term auto-peak value is understood to mean that the maximum value and also the minimum value of an interval, in this case of ten measured values, are taken into consideration. If, as in the above example, ten measured values are combined, and the largest of these ten values provides the value 50, and the smallest of these ten values provides the value 10, the measured value 50 and also the measured value 10 are plotted at the corresponding vertical line of the screen unit 4 and optionally connected to one another by a line. The manner in which the first detector unit 21 should operate can be adjusted as required via an input unit 5. This ensures that even extremely small interference spurs within the filtered, digitised signal 7 can be detected and shown on the display.

Moreover, the digitised signal 7, which is buffered by the at least one data-processing unit 2 in the buffer unit 3, is transformed into the frequency domain. This is preferably implemented by means of a Fast Fourier Transform (German: schnelle Fourier Transformation) in the FFT block 22. This Fourier transform is preferably implemented on coprocessors specially designed for this purpose, which can be embodied, for example, within a digital-signal processor. In order to transform the entire digitised signal 7 into the frequency domain, several Fourier transformations are generally required. The digitised signal 7 transformed into the frequency domain is preferably buffered in a matrix 23. The columns of this matrix 23 preferably represent the frequency range, whereas the rows of the matrix 23 represent the time range. The matrix 23 accordingly forms the spectrogram 30 for the digitised signal 7 transformed into the frequency domain. The manner in which the results of the individual Fourier transformations can be combined to form this matrix 23 can be implemented, for example, using the Welsh method (Welsh-periodogram).

This spectrogram is buffered by the at least one central data-processing unit 2 in the buffer unit 3. Furthermore, as will be explained below, the spectrogram can be transferred to the evaluation unit 6 in its entirety or in parts.

Moreover, the spectrogram of the digitised signal 7 buffered in the matrix 23 can be transferred to a second detector unit 24. The second detector unit 24 decimates the digitised signal 7 transformed into the frequency domain in its resolution in such a manner that the decimated, digitised signal 7 corresponds to a resolution of the screen unit 4. In this context, the second detector unit 24 calculates from at least two values of the digitised signal 7 transformed into the frequency domain either the mean value or the mean squared value or the maximum value or the minimum value or the auto-peak value. If the screen unit 4 provides a resolution in the horizontal axis of, for example, 1000 pixels, and the matrix 23, which contains the spectrogram of the digitised signal 7, provides, for example, 10,000 columns with measured values, the second detector unit 24 combines ten measured values respectively, using the named decimation methods, to form one, new decimated measured value. The same also applies for the vertical axis of the screen unit 4. If the vertical axis of the screen unit 4 also provides, for example, 1000 pixels, and the matrix 23 also comprises 10,000 row entries with measured values, the second detector unit 24 calculates one new, decimated measured value from the measured values from ten rows in each case.

The second detector unit 24 is also used to calculate the characteristic of the spectrum for the digitised signal 7 transformed into the frequency domain and to transfer this to the screen unit 4. In order to obtain a characteristic of the spectrum for the digitised signal 7 transformed into the frequency domain, the second detector unit 24 decimates the spectrogram in such a manner that only a given number of rows, which can be selected, are decimated by means of the decimation methods described. This factual situation will be discussed in greater detail below.

FIG. 3 shows an exemplary embodiment which describes in greater detail the method of functioning of the arrangement 1 according to the invention for signal analysis after the loading of a signal 7 to be analysed. FIG. 3 shows one possibility for how the spectrogram 30 of the digitised signal 7, the characteristic of the spectrum 31 of the digitised signal 7 and the characteristic of the digitised signal 7 present in the time domain can be displayed together and at the same time on the screen unit 4. Accordingly, FIG. 3 shows three diagrams 33, 34, 35, into which the signal 7 to be analysed is plotted in different ways.

The spectrogram 30 of the decimated, digitised signal 7 transformed into the frequency domain is plotted in a first diagram 33. The frequency is plotted on the horizontal axis of the first diagram 33, increasing in the direction towards the right. The time t, which increases downwards, is plotted on the vertical axis of the first diagram 33. The amplitude, or respectively the energy of the individual signal components at a given frequency and at a given time is illustrated by hatching. The darker the hatching is the higher the amplitude or respectively the signal energy. By preference, this information would be displayed on a screen unit 4 by a different choice of colour. The lighter the colour tone, the higher the signal energy would be. It is also evident from the first diagram 33 that there are seven signal impulses $37_1$, $37_2$, $37_3$, $37_4$, $37_5$, $37_6$ and $37_7$, which are broadcast with a time interval from one another, whereas three $37_3$, $37_4$, $37_5$ of these signal impulses $37_1$ to $37_7$ are transmitted on a first frequency, two $37_1$, $37_2$ of these signal impulses $37_1$ to $37_7$ are transmitted on a second frequency, and two $37_6$, $37_7$ of these signal impulses $37_1$ to $37_7$ are transmitted on a third frequency. The signal energy of the signal impulses $37_1$, $37_2$, is highest, followed by the signal impulses $37_3$, $37_4$, $37_4$ and the signal impulses $37_6$, $37_7$.

This digitised signal 7 illustrated in the first diagram 33 is a multi-band GSM signal with different frames (German: Rahmen) in which different slots (German: Schlitze) are active.

A selection range 36 is also plotted in the first diagram 33. This selection range 36 can be adapted arbitrarily in its size (frequency and time), as will be explained below. The digitised signal 7, of which the spectrum 30 over time is illustrated in the first diagram 33 in FIG. 3, as already described, provides a total of seven signal impulses $37_1$, $37_2$, $37_3$, $37_4$, $37_5$, $37_6$ and $37_7$, of which the signal energy, and time and frequency at which they occur, differ from one another in some cases. It is evident that part of the signal impulses $37_2$ and $37_7$ is disposed within the selection range 36.

Moreover, further, narrow-band interference spurs, which are shown by a different hatching and, accordingly, different signal energy, are present in the first diagram 33.

The characteristic of the spectrum 31 of the digitised signal 7 is displayed in the second diagram 34 from FIG. 3. As in the case of the spectrogram 30 from the first diagram 33, the frequency f is also plotted on the horizontal axis. The amplitude A, or respectively the signal energy, is plotted on the vertical axis of the second diagram 34. It is evident that signal amplitudes of different heights are present in the characteristic of the spectrum 31 of the digitised signal 7. Accordingly, two signal peaks are identifiable in the second diagram 34. The first signal peak corresponds to the signal impulse $37_2$, and the second signal peak corresponds to the signal impulse $37_7$. The signal impulses $37_2$, $37_7$ illustrated in the second diagram 34 are the signal impulses $37_2$, $37_7$, which are disposed partially within the selection range 36 in the first diagram 33.

The second detector unit 24 decimates the amplitude values over the selected time range within the selection range 36 according to an adjustable or pre-set decimation mode and displays these decimated values in the second diagram 34. If the selection range 36 from the first diagram 33 were to be displaced slightly downwards, the signal impulse $37_2$ would no longer be displayed in the second diagram 34, whereas, by contrast, the signal impulse $37_7$ would increase in its amplitude dependent upon the decimation mode adjusted. This applies in particular for the mean-value and mean-squared-value decimation modes.

The time characteristic 32 of the digitised signal 7 is displayed in the third diagram 35 from FIG. 3. The time t is plotted on the horizontal axis, whereas the amplitude A, or respectively the signal energy, is plotted on the vertical axis.

Seven signal impulses $37_1$, $37_2$, $37_3$, $37_4$, $37_5$, $37_6$ and $37_7$, which correspond to the signal impulses $37_1$, $37_2$, $37_3$, $37_4$, $37_5$, $37_6$ and $37_7$ from the first diagram 33 are shown. The pass range of the bandpass filter 20 from FIG. 2 is adjusted in such a manner that it corresponds to the frequency range selected by the selection range 36 in the first diagram 33. Undesired interference spurs can be filtered out from the third diagram 35 by varying the position or the size of the selection range 36.

FIG. 4 shows a further exemplary embodiment which describes in greater detail the method of functioning of the arrangement 1 for signal analysis after loading a signal 7 to be analysed. Once again, the three diagrams 33, 34, 35 are shown illustrated on the screen unit 4. The seven signal impulses $37_1$ to $37_7$ are also illustrated in the first diagram 33. By contrast, the selection range 36 is adjusted in such a manner that it covers approximately the same area in its time range and frequency range as the signal impulse $37_2$. The selection range 36 can be adjusted, on the one hand, via the input unit 5 and, on the other hand, via an automatic recognition of the signal amplitude by the at least one central data-processing unit 2, whereas this is compared with a previously specified threshold value.

The second diagram 34 from FIG. 4 shows the characteristic of the spectrum 31 of the digitised signal 7. In this context, the signal impulse $37_2$ which is disposed at the same position as the signal impulse $37_2$ in the first diagram 33, is evident in the second diagram 34. Two vertical limit lines $38_1$, $38_2$, of which the mutual spacing distance includes the same frequency range 39 as the selection range 36 from the first diagram 33, have also been plotted in the second diagram 34.

The time characteristic 32 of the digitised signal 7 is displayed in the third diagram 35. Accordingly, the pass range of the bandpass filter 20 from FIG. 2 is adjusted in such a manner that it is approximately as wide as the frequency range 39. The two signal impulses $37_1$ and $37_2$ are also shown. Two vertical limit lines $40_1$, $40_2$, of which the mutual spacing corresponds to the time range 41, as also specified by the selection range 36 in the first diagram 33, are also displayed.

As soon as the size of the selection range 36 from the first diagram 33 is varied, the vertical limit lines $38_1$, $38_2$ and $40_1$, $40_2$ are automatically adapted by the at least one central data-processing unit with regard to their mutual spacing distance. In this context, the characteristic of the spectrum 31 and the time characteristic 32 of the digitised signal 7 are also adapted at the same time.

It is also possible for the vertical limit lines $38_1$, $38_2$ and $40_1$, $40_2$ to be varied by the input unit 5 with regard to their mutual spacing and their absolute position in the diagrams 34 and 35. As soon as one of the vertical limit lines $38_1$, $38_2$ and $40_1$, $40_2$ is varied, the at least one central data-processing unit 2 updates the selection range 36 in the first diagram 33.

At the same time, the characteristic of the spectrum 31 and of the digitised signal 7 present in the time domain is also changed. This is associated with the fact that the bandpass filter 20 and the first detection unit 21 and/or the second detection unit 24 are matched in their mode of operation by varying one of the vertical limit lines $38_1$, $38_2$ and $40_1$, $40_2$. In this context, it must be specified that the at least one central data-processing unit 2 controls the screen unit 4 in such a manner that the spectrogram 30, the characteristic of the spectrum 31 and the characteristic 32 of the digitised signal 7 in the time domain are displayed together and, above all, simultaneously on the screen unit 4.

As soon as the selection range 36 frames the signal impulse $37_2$ in an optimum manner, the part of the digitised signal 7, which is disposed within the selection range 36, can be transferred to an evaluation unit 6. The selection unit 6 can also include a modulation analysis. As illustrated in FIG. 2, however, it is not the decimated, digitised signal 7 which is transferred to the evaluation unit 6, but rather the digitised signal 7 which has not yet been reduced in its resolution.

FIG. 5A shows an exemplary embodiment which describes in greater detail the method of functioning of the arrangement 1 according to the invention for signal analysis for the analysis of interference spurs 50 within a loaded signal 7. The three diagrams 33, 34, 35, which are displayed together on the screen unit 4 and illustrate the digitised signal 7 simultaneously in different ways, are also shown. The selection range 36, which is moved across the spectrogram 30, is also displayed. In the illustration from FIG. 5A, part of the signal impulse $37_6$ is disposed within the selection range 36. In the first diagram, it is also evident that a small interference spur 50 is also disposed within the selection range 36. The bandpass filter 20 and the first and second detector unit 21, 24 are adapted correspondingly to the selection range 36. In the second diagram 34, it is evident that the vertical limit lines $38_1$, $38_2$ include within their mutual spacing distance the same frequency range 39 as the selection range 36. The signal impulse $37_6$ is still disposed to a certain extent within the vertical limit lines $38_1$ and $38_2$. It is also shown very clearly that an interference spur 50 (English: spur) occurs within the selection range 36.

In the third diagram 35 from FIG. 5A, the various signal impulses $37_1$, $37_2$, $37_3$, $37_4$, $37_5$ which are not filtered through the bandpass filter 20, are also shown. However, the signal impulses $37_6$, $37_7$ have been filtered out. Similarly, the vertical limit lines $40_1$, $40_2$ are displayed. In this diagram, the interference spur 50 is not visible because of the wide pass range of the bandpass filter 20. However, this interference spur 50 can be displayed in the third diagram 35 by selecting a different decimation mode.

FIG. 5B shows a further exemplary embodiment, which describes in greater detail the method of functioning of the arrangement 1 according to the invention for signal analysis for the analysis of interference spurs 50 within a loaded signal 7. In the first diagram 33, it is evident that the selection range 36 has been adjusted in such a manner that it frames the interference spur 50 as accurately as possible. As already described, this can be achieved by adjusting the selection range 36 in the first diagram 33 roughly to the interference spur 50 and then moving the vertical limit lines $38_1$, $38_2$ and $40_1$, $40_2$ in the second diagram 34 and the third diagram 35 as close as possible to the interference spur. In this first diagram 33, a further broadband interference spur 51 is also shown. However, this will be described separately below.

In the second diagram 34, it is also clearly visible that the vertical limit lines $38_1$ and $38_2$ frame the interference spur 50 as accurately as possible. In this context, the characteristic of the spectrum 31 is also still shown within this range with the signal impulse $37_6$. In the third diagram 35, the vertical limit lines $40_1$ and $40_2$ are also adjusted in such a manner that they frame the interference spur 50 as accurately as possible. The characteristic 32 of the digitised signal 7 present in the time domain is also very clearly evident with its two signal impulses $37_1$ and $37_2$.

Moreover, the content of the selection range 36 can be transferred by the at least one central data-processing unit 2 to the evaluation unit 6 in order to draw more accurate conclusions about the type of interference spur 50. As already mentioned, the un-decimated, digitised signal 7 is transferred to the evaluation unit 6 in this context.

FIG. 6 shows an exemplary embodiment of a flow chart which describes in greater detail the method of functioning of the arrangement 1 according to the invention for signal analysis. As soon as the digitised signal 7 is loaded from a signal analyser 8 or an oscilloscope into the arrangement 1 for signal analysis, the first method step $S_1$ can be implemented. Within the first method step, the at least one central data-processing unit 2 calculates the spectrum 31 and the spectrogram 30 of the digitised signal 7. This takes place by means of conventional, known methods. In order to avoid repeating this calculation constantly in the case of a change of the selection range 36, it is advantageous if the at least one central data-processing unit 2 buffers the digitised signal 7 transformed into the frequency domain in a buffer unit 3.

Following this, the second method step $S_2$ is implemented, in which the at least one central data-processing unit 2 controls the screen unit 4 in such a manner that the characteristic of the spectrum 31, of the spectrogram 30 and the characteristic 32 of the digitised signal 7 present in the time domain are displayed together on the screen unit 4.

Method step $S_3$ can then be implemented. Within this method step, the spectrogram 30 of the digitised signal 7 is displayed in a first diagram 33. The characteristic of the spectrum 31 of the digitised signal 7 is displayed in a second diagram 34, and the characteristic 32 of the digitised signal 7 present in the time domain in a third diagram 35. The corresponding signals are displayed by the at least one central data-processing unit 2 in the diagrams 33, 34, 35, on the screen unit 4 at the same time.

Moreover, method step $S_4$ can then be implemented. Within method step $S_4$, a frequency range 39 and a time range 41 can be freely selected within the spectrogram 30, whereas, at the same time, the characteristic of the spectrum 31 and the time characteristic 32 of the digitised signal 7 can be updated by the at least one central data-processing unit 2 dependent upon the selected frequency range 39 and the time range 41, and whereas the updated characteristics 31, 32 are displayed by the former on the screen unit 4. It is also possible for the frequency range 39 selected in the spectrogram 30 to be plotted in the second diagram 34 by the at least one central data-processing unit 2, and for the time range 41 selected in the spectrogram 30 to be plotted by the at least one central data-processing unit 2 in the third diagram 35. The free selection of the frequency range 39 and the time range 41 also relates to the arbitrary adjustment of the selection range 36 with regard to its position and its dimensions within the spectrogram 30.

Method step $S_5$ can be implemented after method step $S_3$ or method step $S_4$. Within method step $S_5$, the frequency range 39 in the second diagram 34 for the characteristic of the spectrum 31 can be freely selected, whereas the time characteristic of the digitised signal 7 is updated on the basis of the frequency range 39 selected by the at least one central data-processing unit 2 in the third diagram 35, and/or whereas the selected frequency range 39 is plotted in the first diagram 33 for the spectrogram 30 by the at least one central data-processing unit 2, or the already present selection range 36 is adapted accordingly.

Method step $S_6$ can be implemented following method step $S_3$, $S_4$ or $S_5$. Within method step $S_6$, the time range 41 in the third diagram 35 for the time characteristic 32 of the digitised signal 7 can be freely selected, whereas the at least one central data-processing unit 2 updates the characteristic of the spectrum 31 within the second diagram 34 for the selected time range 41, and/or whereas the at least one central data-processing unit 2 plots the selected time range 41 into the first diagram 33 for the spectrogram 30, or respectively adapts the selection range 36 accordingly.

Finally, FIG. 7 shows a further exemplary embodiment of a flow chart, which describes in greater detail the method of functioning of the arrangement 1 according to the invention for signal analysis. In the further course, method step $S_7$ is implemented, which is, however, preferably not necessarily implemented before method step $S_2$. Within method step $S_7$, the digitised signal 7 present in the time domain is filtered through a bandpass filter 20, whereas the pass range of the bandpass filter 20 corresponds to the selected frequency range 39 of the first diagram 33 for the spectrogram 30 or to the selected frequency range 39 of the second diagram 34 for the characteristic of the spectrum 31. Since this bandpass filter 20 is a digital filter, its parameters can be adapted particularly readily to the current settings of the selection range 36. If no frequency range 39 has been selected, a standard frequency range is set, which is obtained, for example, from the bandwidth of the digitised signal 7.

After method step $S_7$, method step $S_8$ can be implemented. Method step $S_8$ is also preferably implemented before method step $S_2$. Within method step $S_8$, the filtered, digitised signal 7 can be decimated in its resolution by a first detector unit 21, so that the decimated, digitised signal 7 corresponds to a resolution of the screen unit 4, whereas either the mean value or the mean squared value or a maximum value or the minimum value or the auto-peak value from at least two values of the digitised signal 7 is calculated by the first detector unit 21. Within method step $S_8$, it is also possible for the digitised signal 7 transformed into the frequency domain to be decimated in its resolution by the second detector unit 24, so that the decimated, digitised signal 7 corresponds to a resolution of the screen unit 4, whereas either the mean value or the mean squared value or the maximum value or the minimum value or the auto-peak value is calculated by the second detector unit 24 from at least two values of the digital signal 7.

Following method step $S_7$ or method step $S_8$, method step $S_9$ can be implemented. However, method step $S_9$ is preferably implemented after method step $S_4$, method step $S_5$ or method step $S_6$. In method step $S_9$, the part of the digitised signal 7, which is disposed within the selected time range 41 and/or within the selected frequency range 39 is transferred by the at least one central data-processing unit 2 to an evaluation unit 6. The part which is disposed within the selection range 36, or respectively within the vertical limit lines $38_1$, $38_2$ or $40_1$, $40_2$ and is transferred to the selection unit 6, relates to the part of the digitised signal 7, which has not yet been decimated. A given part of the spectrum, the time characteristic 32 of the digitised signal 7 or the spectrogram 30 can be transferred to the selection unit 6.

The filter, which is realised as the bandpass filter 20, is preferably a raised-cosine filter (German: ansteigender Kosinus filter). However, other types of filter can also be used.

Within the scope of the invention, all of the features described and/or illustrated can be combined with one another as required. In particular, the dependent claims, relating to the method, can also be combined with the device claims relating to the arrangement 1 for signal analysis and vice versa.

The invention claimed is:

1. An arrangement for signal analysis, comprising:
   at least one central data-processing unit;
   a screen unit connected to the at least one central data-processing unit; and
   at least one buffer unit connected to the at least one central data-processing unit,
   wherein the at least one central data-processing unit calculates a spectrogram from a digitised signal,
   wherein the at least one central data-processing unit is configured to control the screen unit to display the spectrogram of the digitised signal and characteristic of the digitised signal present in a time domain together thereon,
   wherein the at least one buffer unit includes a matrix, the digitised signal is transformed into a frequency domain by the at least one central data-processing unit, and frequency domain data is buffered in the matrix, and
   wherein the matrix forms the spectrogram for the digitised signal transformed into the frequency domain.

2. The arrangement for signal analysis according to claim 1, wherein the digitised signal is buffered by the at least one central data-processing unit in the at least one buffer unit.

3. The arrangement for signal analysis according to claim 1, wherein the spectrogram of the digitised signal is displayed on the screen unit in a first diagram, and the characteristic of the digitised signal present in the time domain is displayed in a second diagram, in each case by the at least one central data-processing unit and at the same time.

4. The arrangement for signal analysis according to claim 3, wherein a frequency range and a time range within the spectrogram are freely selected, and the characteristic of the digitised signal is updated by the at least one central data-processing unit for the selected frequency range and time range and displayed on the screen unit, and
   wherein the time range selected in the spectrogram is plotted in a third diagram by the at least one central data-processing unit.

5. The arrangement for signal analysis according to claim 1,
   wherein columns of the matrix represent a frequency range, and rows of the matrix represent a time range.

6. The arrangement for signal analysis according to claim 3, wherein a time range within the second diagram is freely selected for the characteristic of the digitised signal, and
   wherein the time range selected in the second diagram is plotted in the first diagram for the spectrogram by the at least one central data-processing unit.

7. The arrangement for signal analysis according to claim 3, wherein the digitised signal present in a time range is filtered by a bandpass filter, and
   wherein a pass range of the bandpass filter corresponds to a selected frequency range of the first diagram for the spectrogram.

8. The arrangement for signal analysis according to claim 7, wherein the filtered, digitised signal is decimated in its resolution by a first detector unit, so that the decimated, digitised signal corresponds to a resolution of the screen unit,
   wherein a mean value, a mean squared value, a maximum value, a minimum value, or an auto-peak value of at least two values of the digitised signal is calculated by the first detector unit,
   wherein the digitised signal transformed into a frequency domain is decimated in its resolution by a second detector unit, so that the decimated, digitised signal corresponds to a resolution of the screen unit, and
   wherein the mean value, the mean squared value, the maximum value, the minimum value, or the auto-peak value of at least two values of the digitised signal is calculated by the second detector unit.

9. The arrangement for signal analysis according to claim 4, wherein a part of the digitised signal which is disposed within the selected time range and/or frequency range is transferred to an evaluation unit by the at least one central data-processing unit.

10. A method for operating an arrangement for signal analysis, the arrangement comprising at least one central data-processing unit, a screen unit connected to the at least one central data-processing unit, and at least one buffer unit connected to the at least one central data-processing unit, the method comprising:
calculating a spectrogram from a digitised signal by the at least one central data-processing unit;
displaying the spectrogram of the digitised signal and of characteristic of the digitised signal present in a time domain together on the screen unit by the at least one central data-processing unit; and
transforming the digitised signal into a frequency domain by the at least one central data-processing unit and buffering the digitised signal being in a matrix included in the at least one buffer unit, thereby forming the spectrogram for the digitised signal transformed into the frequency domain.

11. The method according to claim 10, further comprising displaying the spectrogram of the digitised signal in a first diagram and of the characteristic of the digitised signal present in the time domain in a second diagram at the same time on the screen unit by the at least one central data-processing unit.

12. The method according to claim 11, further comprising:
freely selecting a frequency range and a time range within the spectrogram; and
plotting the time range selected in the spectrogram into the second diagram by the at least one central data-processing unit.

13. The method according to claim 11, further comprising:
freely selecting a time range within the second diagram for the characteristic of the digitised signal; and
plotting the time range selected in the second diagram into the first diagram for the spectrogram by the at least one central data-processing unit.

14. The method according to claim 13, further comprising filtering the digitised signal present in the time domain by a bandpass filter,
wherein a pass range of the bandpass filter corresponds to a selected frequency range of the first diagram for the spectrogram.

15. The method according to claim 14, further comprising:
decimating the filtered digitised signal in its resolution by a first detector unit, so that the decimated, digitised signal corresponds to a resolution of the screen unit, wherein either a mean value, a mean squared value, a maximum value, a minimum value, or an auto-peak value of at least two values of the digitised signal is calculated by the first detector unit; and
decimating the digitised signal transformed into a frequency range in its resolution by a second detector unit, so that the decimated, digitised signal corresponds to a resolution of the screen unit, wherein either the mean value, the mean squared value, the maximum value, the minimum value, or the auto-peak value of at least two values of the digitised signal is calculated by the second detector unit.

16. The method according to claim 11, further comprising transferring a part of the digitised signal which is disposed within a selected time range and/or frequency range by the at least one central data-processing unit to an evaluation unit.

17. A non-transitory computer-readable storage medium storing a computer program in order to implement the method according to claim 10 when the computer program is executed on a computer or a digital signal processor.

18. The arrangement for signal analysis according to claim 1, wherein the spectrogram provides time information for certain spans of interest for a user.

19. The arrangement for signal analysis according to claim 1, wherein the spectrogram provides time point information for points of a visualized spectrum to a user.

20. The arrangement for signal analysis according to claim 1, wherein a user sets and/or resets a start time of the spectrogram and/or a spectrogram area of interest.

21. The arrangement for signal analysis according to claim 3, wherein a frequency range of interest is selected by a user for analysis in a spectrum or the spectrogram.

22. The arrangement for signal analysis according to claim 21, wherein a time domain analysis is configured to analyze an input signal in the time domain of the signal for a frequency range greater than a selected frequency for display in the spectrum or spectrogram.

23. The arrangement for signal analysis according to claim 3, wherein a decimation rate for a spectrum or spectrogram and the time domain displayed are different.

24. The arrangement for signal analysis according to claim 3, further comprising an analog mixer,
wherein for signals that can be accepted at an analog to digital converter without down conversion according to the Nyquist theorem, the analog mixer is bypassed.

25. The arrangement for signal analysis according to claim 3, further comprising a digital downconverter, which is fully configurable, and is configured to transfer the signal with or without frequency shifting depending on user inputs and the signal provided to an input port.

* * * * *